(12) United States Patent
LaFrance et al.

(10) Patent No.: US 8,996,144 B2
(45) Date of Patent: Mar. 31, 2015

(54) REMOTE DISCONNECT SWITCH ASSEMBLY

(75) Inventors: Ryan Marc LaFrance, Marietta, GA (US); Scott Michael Shill, Atlanta, GA (US); Steven Lee Bietz, Cumming, GA (US); Subramanyam Satyasurya Chamarti, Johns Creek, GA (US)

(73) Assignee: General Electric Company, Schenectady, NY (US)

( * ) Notice: Subject to any disclaimer, the term of this patent is extended or adjusted under 35 U.S.C. 154(b) by 645 days.

(21) Appl. No.: 13/267,711

(22) Filed: Oct. 6, 2011

(65) Prior Publication Data

US 2013/0090748 A1   Apr. 11, 2013

(51) Int. Cl.
  *G05B 11/32* (2006.01)
  *H01H 71/12* (2006.01)
  *H01H 1/20* (2006.01)

(52) U.S. Cl.
  CPC ............... *H01H 71/125* (2013.01); *H01H 1/20* (2013.01)
  USPC ........................................................ 700/67

(58) Field of Classification Search
  CPC ..... H01H 71/125; H01H 1/20; H01H 11/005; H01H 36/0006; G05B 11/32; G05B 15/02
  USPC ........................................................ 700/67
  See application file for complete search history.

(56) References Cited

U.S. PATENT DOCUMENTS

| 7,561,681 | B2 | 7/2009 | Booth et al. |
| 7,656,641 | B2 * | 2/2010 | Mason et al. ................. 361/160 |
| 8,040,664 | B2 * | 10/2011 | Makinson et al. ............ 361/661 |
| 8,395,464 | B2 * | 3/2013 | Pontin et al. .................. 335/121 |
| 2001/0010032 | A1 | 7/2001 | Ehlers et al. |
| 2005/0174256 | A1 * | 8/2005 | Berg ........................ 340/870.39 |
| 2008/0086394 | A1 | 4/2008 | O'Neil et al. |
| 2008/0154624 | A1 | 6/2008 | O'Neil |

FOREIGN PATENT DOCUMENTS

| EP | 0437003 B1 * | 10/1990 | ............. H01H 47/22 |
| EP | 1936650 A1 | 6/2008 | |

* cited by examiner

*Primary Examiner* — Robert Fennema
*Assistant Examiner* — Sivalingam Sivanesan
(74) *Attorney, Agent, or Firm* — Fletcher Yoder, P.C.

(57) ABSTRACT

Described herein are embodiments of a remote disconnect switch assembly. In one embodiment, the remote disconnect switch assembly comprises: an actuator; a shuttle that is operably moved by the actuator; one or more disconnect switches that are opened or closed by movement of the shuttle; one or more sensors; a communication interface; and a processor, wherein the processor is operably connected with the actuator, the one or more sensors and the communication interface, and wherein the processor is configured to: communicate with one or more other computing devices over a network using the communication interface; receive signals from the one or more sensors; and cause the actuator to operate in accordance with the signals received from the one or more sensors or the communications with the one or more other computing devices.

16 Claims, 7 Drawing Sheets

REMOTE DISCONNECT SWITCH ASSEMBLY

FIELD OF THE INVENTION

This invention generally relates to utility devices, and in particular to a remote disconnect switch assembly.

BACKGROUND OF THE INVENTION

The increasing demand for energy and the use of finite resources for energy production have led to the use of increased technology for the production, transmission, distribution and consumption of energy in order to make, distribute and use energy more efficiently and wisely. To that end, utility service providers have begun employing information technology systems integrated with their energy production, transmission, distribution and metering systems to enable more efficient monitoring and operation of such systems. Concurrently, vendors and manufacturers have also begun employing similar technology in products and devices that consume electricity, such as appliances (e.g., refrigerators, washing machines and dryers, dishwashers, HVAC systems, lighting systems, stoves, water heaters, etc.) and electronics (e.g., televisions, stereos, computers, etc.). These efforts are often broadly categorized as smart grid, smart meter and smart appliance or smart device technologies.

The smart grid marries information technology with the current electrical infrastructure. The smart grid is, in essence, an "energy Internet," delivering real-time energy information and knowledge—empowering smarter energy choices. Roles for the smart grid include enabling the integration and optimization of more renewable energy (such as wind and solar); driving significant increases in the efficiency of the electrical network; and, empowering consumers to manage their energy usage and save money without compromising their lifestyle.

Smart grid technologies provide utilities and consumers with real-time knowledge and decision-making tools that empowers them to save energy, resources, money, and the environment. The smart grid is not a singular product, but rather a collection of hardware and software that works together to make today's electrical grid more intelligent. Similar to how the Internet turned a disaggregated collection of computers into a more powerful tool, overlaying the current power infrastructure with smart grid technology is like connecting the Internet to the computer, making an already useful machine much better and providing people with information to make intelligent decisions. Similarly, the smart grid, or the "energy Internet," empowers consumers, businesses and utilities to make smarter energy choices.

Smart grid components include automation software and intelligent electronic hardware systems that control the transmission and distribution grids. Smart grid automation technologies—such as energy management systems and distribution management systems—help provide real-time knowledge and control over the distribution and transmission grids. On the transmission side, Energy Management Systems (EMS) provide real-time information on the grid's status, helping utilities automate various grid functionalities remotely. This automation technology helps utilities choose the best, most affordable generation mix (known as economic dispatch), keeping costs lower for consumers and businesses; reduce losses and waste in the delivery of power to drive a more efficient system; and maintain system reliability to help ensure a steady supply of power to customers. Distribution Management System (DMS) comprises the smart grid automation technology that provides utilities with real-time information about the distribution network and allows utilities to remotely control switches in the grid. The DMS is the heart of a smarter distribution grid; enabling utilities to manage distributed renewable generation, support grid efficiency technologies, and control the isolation and restoration of outages. Without DMS, the utility gets very little real-time information about the distribution grid and can't realize many of the benefits of a smarter grid.

Furthermore, smart grid technologies can extend beyond the electrical grid. With smart grid technologies in the home—like smart meters, smart energy panels, and smart appliances—consumers can have access to more accurate data and knowledge about electricity pricing, helping them save money and lower their environmental footprint.

Currently, most power companies offer one set price for electricity throughout the day, regardless of how expensive it is to produce. Most consumers don't know that it costs much more to produce energy during the peak hours of the day—typically between 2 p.m. and 7 p.m.—than it does at any other time. A smart meter can communicate time of use pricing via smart home energy panels or other display devices to help consumers make smarter energy choices throughout the day. Consumers will be more likely to use high-consuming devices during off-peak pricing periods, when electricity prices are cheaper. With smart meters, buying electricity is like buying other consumer goods—with price impacting purchase decision. For example, a consumer can choose to have their house pre-cooled before arriving home to ensure the air conditioning system can remain off during expensive peak pricing hours, without impacting the consumer's comfort level. A consumer can also have their water pre-heated to avoid peak prices and lower their energy bill. A year-long study by the U.S. Department of Energy showed that real-time pricing information provided by the smart meter helped consumers reduce their electricity costs 10% on average and their peak consumption by 15%.

Smart meters can also enable consumers to pre-pay their electricity bill and help utilities better detect and manage outages. Smart meters coupled with advanced metering infrastructure (AMI) helps pinpoint problems on the grid, allowing utilities to determine exactly which customers are without power. Compare this to today, when many utilities still wait for customer calls to notify them of outages.

Smart appliances can work in concert with smart meters and the smart grid to avoid peak-hour energy use and top-tier pricing-without any negative impact on the consumer-by adapting to price signals from the utility. For example, a dryer may automatically switch from high heat to "fluff" if electricity hits a certain per-kilowatt-hour rate—even if the homeowner is at work. Or, the automatic defrost on a refrigerator can delay itself until a time of reduced electricity rates. If the freezer delays the defrost cycle until after peak energy hours, consumers pay less for the same amount of energy. There are countless ways to conserve energy and save money when smart appliances are coupled with smart meters and time-of-use pricing information including, for example, updating software or firmware of a smart appliances using the smart grid and smart meter infrastructure. The smart grid, smart meter and smart appliance technologies enable utilities to communicate (duplex) with smart appliances in the home. This ability creates opportunities beyond that of energy management.

To implement these smart technologies, utilities need smart components, such as disconnect switches having processing and sensing capabilities built into the switch and an ability to communicate with other smart devices.

BRIEF DESCRIPTION OF THE INVENTION

In accordance with one aspect, a remote disconnect switch assembly is described. In one embodiment, the remote disconnect switch assembly comprises: an actuator; a shuttle that is operably moved by the actuator; one or more disconnect switches that are opened or closed by movement of the shuttle; one or more sensors; a communication interface; and a processor, wherein the processor is operably connected with the actuator, the one or more sensors and the communication interface, and wherein the processor is configured to: communicate with one or more other computing devices over a network using the communication interface; receive signals from the one or more sensors; and cause the actuator to operate in accordance with the signals received from the one or more sensors or the communications with the one or more other computing devices.

In accordance with another aspect, a remote disconnect switch assembly is described. In one embodiment, the remote disconnect switch assembly comprises: an enclosure; an actuator; a shuttle that is operably moved by the actuator; one or more disconnect switches that are opened or closed by movement of the shuttle; one or more sensors; a communication interface; and a processor, wherein the processor is operably connected with the actuator, the one or more sensors and the communication interface, and wherein the processor is configured to: communicate with one or more other computing devices over a network using the communication interface; receive signals from the one or more sensors; and cause the actuator to operate in accordance with the signals received from the one or more sensors or the communications with the one or more other computing devices, wherein the actuator, shuttle, one or more disconnect switches, one or more sensors, communication interface, and processor are located substantially within the enclosure.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
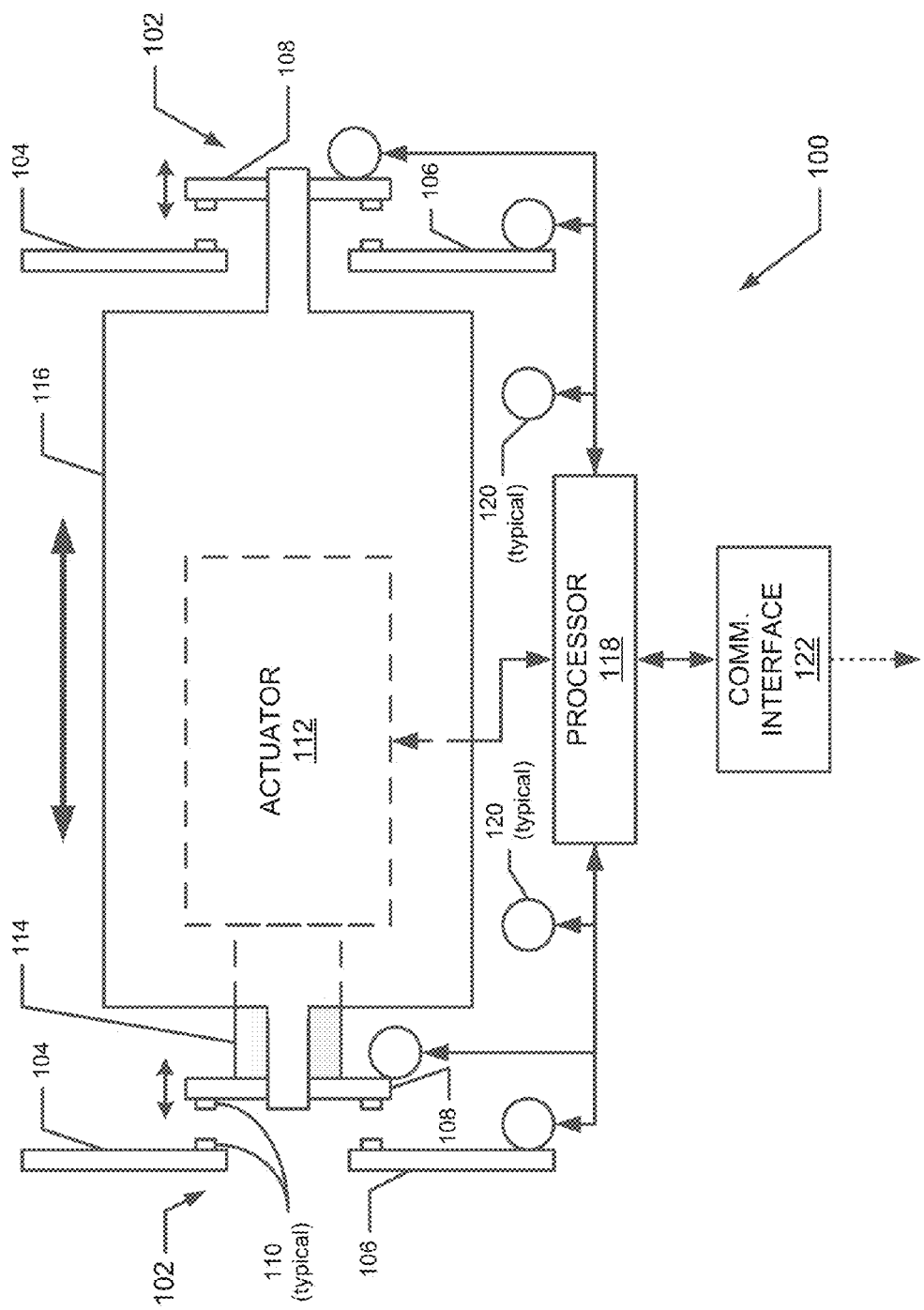
FIG. 1 illustrates an embodiment of a remote disconnect switch assembly.

FIG. 1 illustrates an embodiment of a remote disconnect switch assembly 100. The embodiment shown in FIG. 1 is comprised of two disconnect switches 102, though more or fewer disconnect switches 102 are contemplated within the scope of embodiments of the invention. Each embodiment of a disconnect switch 102 is comprised of a source side 104, a load side 106, and a bridging portion 108. Contacts 110 on the bridging portion 108 come in contact with contacts 110 on the source 104 and load 106 sections when the switch 102 is closed. Similarly, the contacts 110 are separated when the switch 102 is opened. In one aspect, an actuator 112 is used to open and close the one or more switches 102. In one aspect, the actuator 112 comprises an electrical solenoid though other types of actuators such as hydraulic or pneumatic actuators are contemplated with the scope of embodiments of the present invention. In one aspect, as shown in FIG. 1, the actuator 112 is connected to one of the bridging portions 108 through a plunger 114. When the plunger 114 moves, it opens or closes the disconnect switch 102 which comprises the bridging portion 108 connected to the plunger 114. Furthermore, connected to the bridging portion 108 is a shuttle 116. For example, in one aspect, the shuttle 116 is a container that holds an actuator 112 such as a solenoid with a plunger 114 situated approximately within the center of the solenoid. As the solenoid is energized in one direction or another, the plunger 114 extends or retracts. The one end of the plunger 114 is situated within the solenoid and the other end of the plunger 114 is affixed to the bridging portion 108. So, as the plunger 114 retracts/extends, the shuttle 116 moves to open and close the contacts 110 of the disconnect switches 102. The shuttle 116 can be connected to one or more other bridging portions 108 of one or more other disconnect switches 102, thereby causing the opening or closing of the other disconnect switches 102 in concert with movement of the plunger 114. Though only one other disconnect switch 102 is shown in FIG. 1, it is to be appreciated that there can be two, three, four, etc. other switches 102. The actuator 112 acts under control of a processor 118. Generally, the processor 118 causes the actuator 112 to operate by electronically causing a switch, such as a field-effect transistor (FET), to turn on drive circuitry (not shown) that will drive the coil of a solenoid serving as the actuator 112 to actuation. In one aspect, the FET can be used to switch the direction of current through the coil in order to cause the plunger 114 to extend or retract, as desired. In one aspect, the processor 118 comprises a MSP430™ microcontroller as available from Texas Instruments Incorporated, Dallas, Tex., USA, though other processors are contemplated within the scope of embodiments of the present invention.

Further comprising the embodiment of a remote disconnect switch assembly 100 as shown in FIG. 1 are one or more sensors 120 and a communication interface 122. The one or more sensors 120 can be, for example, one or more of an accelerometer, a temperature sensor, a magnetic sensor, a limit switch, a humidity sensor, and the like. In one aspect, the one or more sensors 120 can be used to detect the current state (i.e., opened or closed) of each of the one or more disconnect switches 102 and provide this state information to the processor 118. The communication interface 122 enables the processor 118 to communicate with other devices over a network (not shown). The network can be wired (including fiber optic), wireless, or a combination of wired and wireless. In one aspect, the communication interface 122 can be a wireless transceiver using, for example, IEEE standard 802.11n (WiFi), ZigBee™, BlueTooth™, or other wireless protocols. In one aspect, the network (not shown) can be, for example, an advanced metering infrastructure (AMI) network as described herein, though other networks are contemplated within the scope of embodiments of the present invention.

The processor 118 is operably connected with the actuator 112, the one or more sensors 120, and the communication interface 122. Generally, these devices are interconnected through a wired bus, though wireless communications are also contemplated. In one aspect, the processor 118 is configured to communicate with one or more other computing devices over a network using the communication interface 122; receive signals from the one or more sensors 120; and cause the actuator 112 to operate in accordance with the signals received from the one or more sensors 120 or the communications with the one or more other computing devices.

Figure 2:
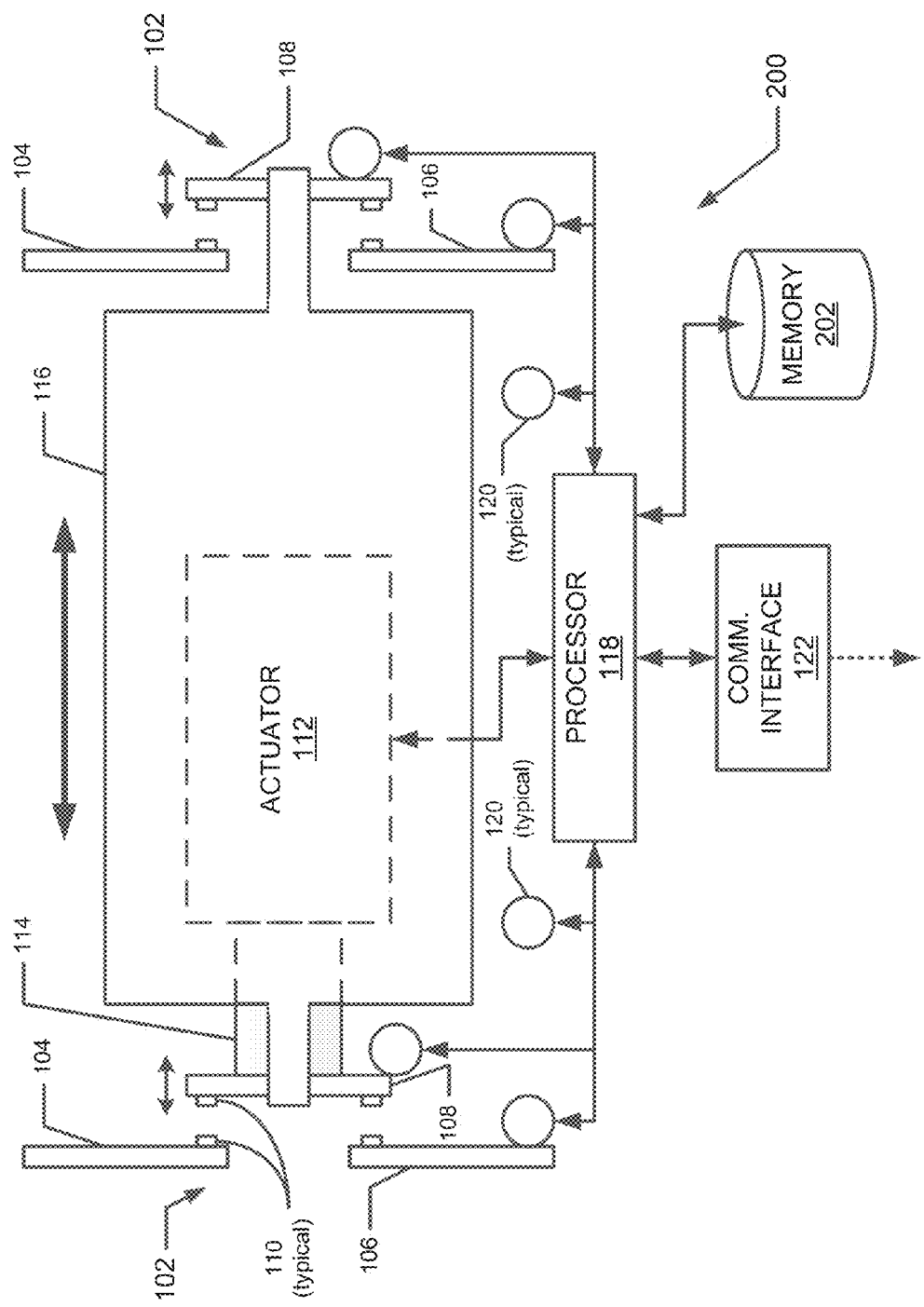
FIG. 2 illustrates another embodiment of a remote disconnect switch assembly.

FIG. 2 is an illustration of an embodiment of remote disconnect switch assembly 200 comprised of the embodiment of remote disconnect switch assembly 100 of FIG. 1 and further comprising a memory 202. In one aspect, the memory 202 can be a volatile memory. In another aspect, the memory 202 can be a non-volatile memory. In one aspect, the memory 202 can be operably connected with the processor 118, wherein information about the remote disconnect switch assembly 200 is stored on the memory 202. In one aspect, the information about the remote disconnect switch assembly 200 stored on the memory 202 comprises one or more of an actual state (i.e., opened or closed) of the one or more disconnect switches 102, temperature information, vibration information, humidity information, tamper detection information, actuation information about the one or more disconnect switches 102, information about the actuator 112, operating statistics, passwords and authentication information, and the like. In one aspect, the information stored on the memory 202 comprises one or more of a desired state (i.e., opened or closed) of the one or more disconnect switches 102. In one aspect, the processor 118 receiving signals from the one or more sensors 120 and causing the actuator 112 to operate in accordance with the signals received from the one or more sensors 120 comprises the processor 118 receiving information about the actual states of the one or more disconnect switches 102 from the one or more sensors 120 or as stored on the memory 202, comparing the actual states to the desired states of the one or more disconnect switches 102, as the desired states are stored in the memory 202, and causing the one or more disconnect switches 102 to open or close in accordance with the desired states if the actual states of the one or more disconnect switches 102 are different than the desired states. In one aspect, information stored on the memory 202 can be read from the memory by the processor 118 and transmitted to another device using the communication interface 122. In another aspect, information can be received by the processor 118 using the communication interface 122 and stored on the memory 202.

Figure 3:
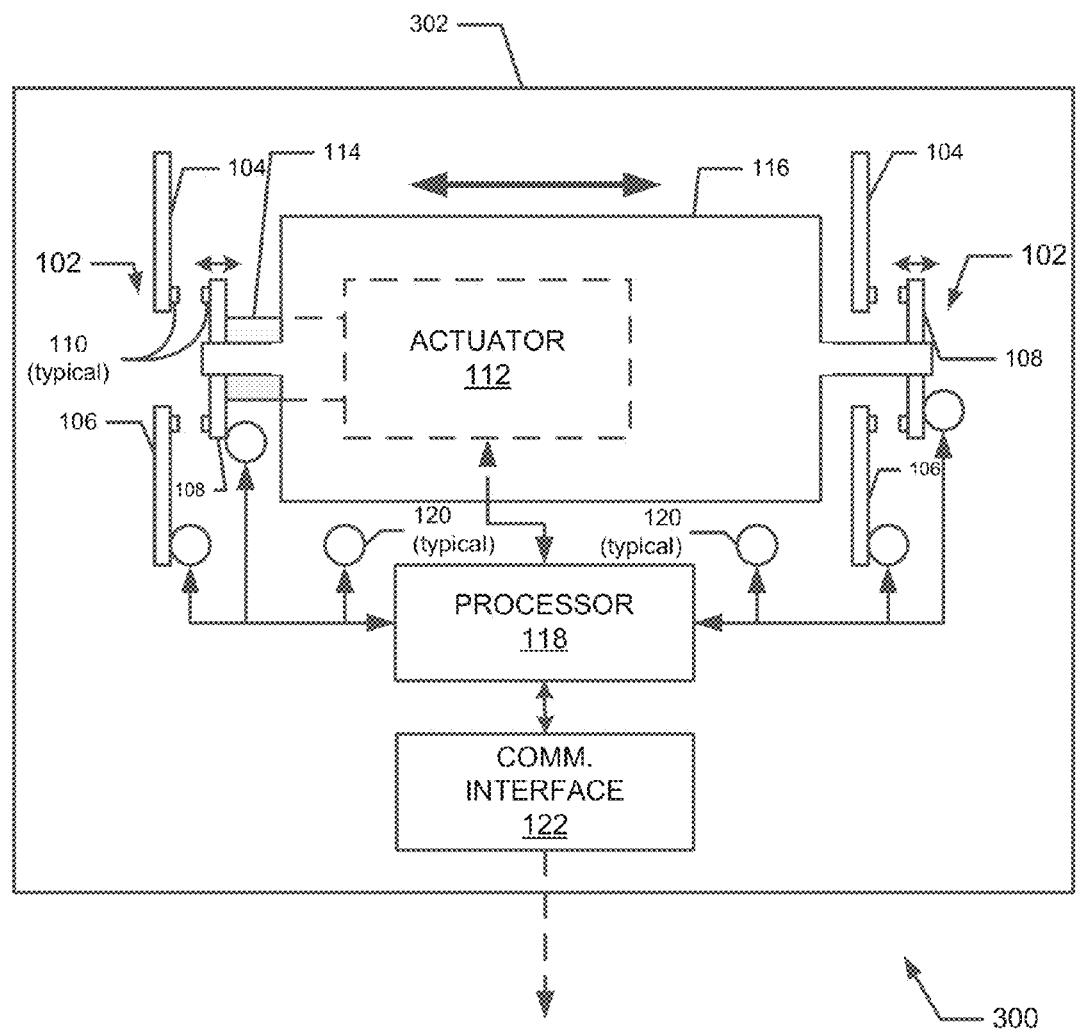
FIG. 3 illustrates yet another embodiment of a remote disconnect switch assembly.

FIG. 3 is an illustration of a stand-alone remote disconnect switch assembly 300 wherein the actuator 112, shuttle 116, one or more disconnect switches 102, one or more sensors 120, communication interface 122, and processor 118 are located substantially within an enclosure 302. The enclosure 302 can be comprised completely or partially of one or more of metal, plastic, fiberglass, or any other suitable material. The enclosure 302 can be weather-tight or made for installation in a dry location. The enclosure may be configured such that it has electrical ratings at or above the ratings of the components that comprise the remote disconnect switch assembly situated substantially within the enclosure 302. Though the embodiment of a stand-alone remote disconnect switch assembly 300 shown in FIG. 3 does not show a memory 202, it is to be appreciated that the memory 202 may or may not be included within this embodiment of the invention.

Figure 4:
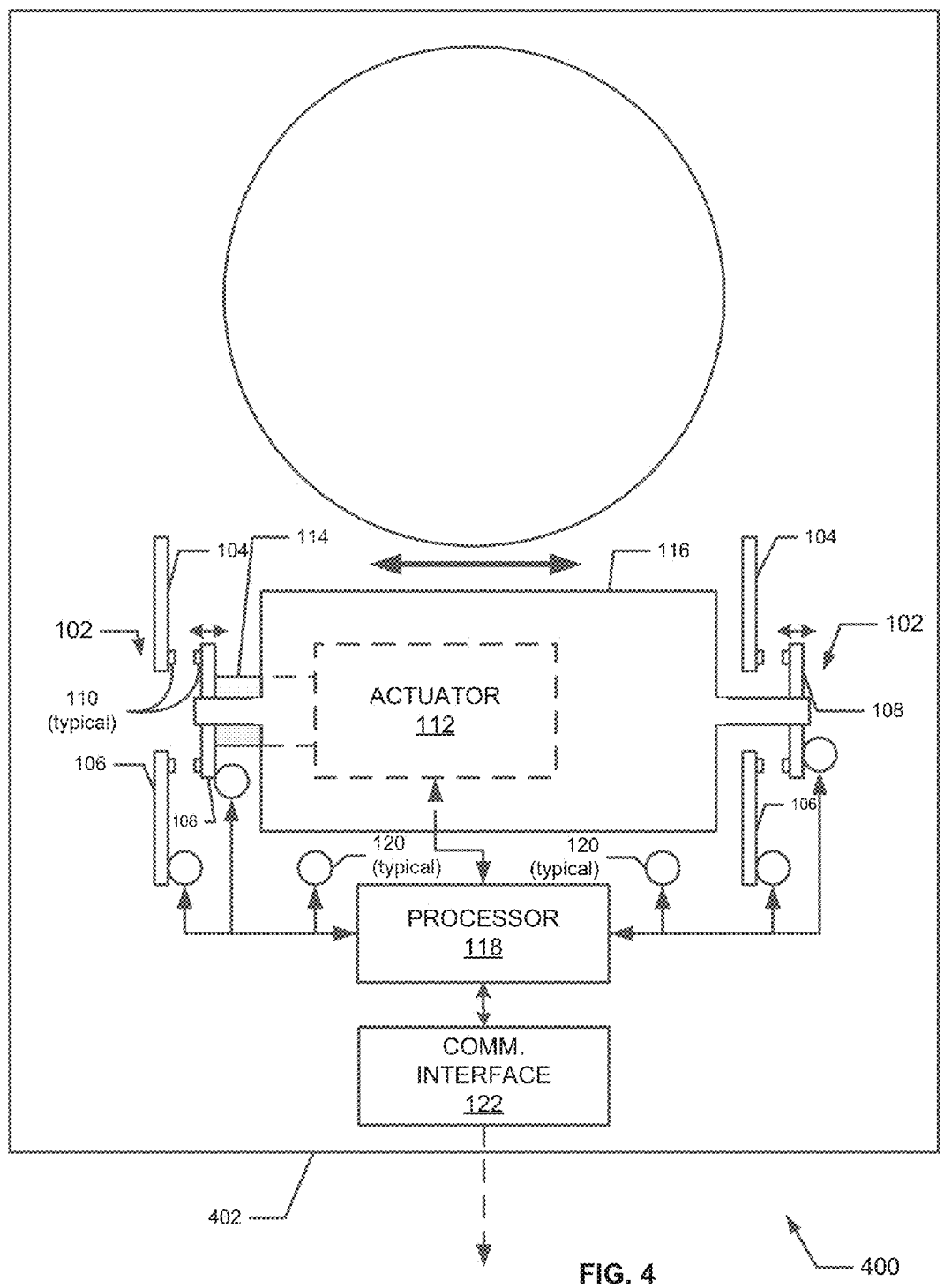
FIG. 4 illustrates yet another embodiment of a remote disconnect switch assembly.

FIG. 4 illustrates an embodiment of a remote disconnect switch assembly 400 wherein the actuator 112, shuttle 116, one or more disconnect switches 102, one or more sensors 120, communication interface 122, and processor 118 are located substantially within the base of a utility revenue meter 402. In one aspect, the utility revenue meter 402 comprises an electric utility revenue meter. In one aspect, the utility revenue meter 402 comprises a smart meter. Smart meters are among the fundamental building blocks of smart grid deployments. They track and report energy usage by time of day, enabling utilities to charge less for electricity used during off-peak hours. As a result, consumers can choose to shift energy-intensive activities to times when rates are lower to save on energy costs. In general, smart devices can be configured to communicate with a smart meter and smart meters are configured to communicate with the smart grid. Generally, these communications are duplex. One non-limiting example of a smart meter is the GE I210+c meter as available from General Electric Company (Schenectady, N.Y.).

Figure 5:
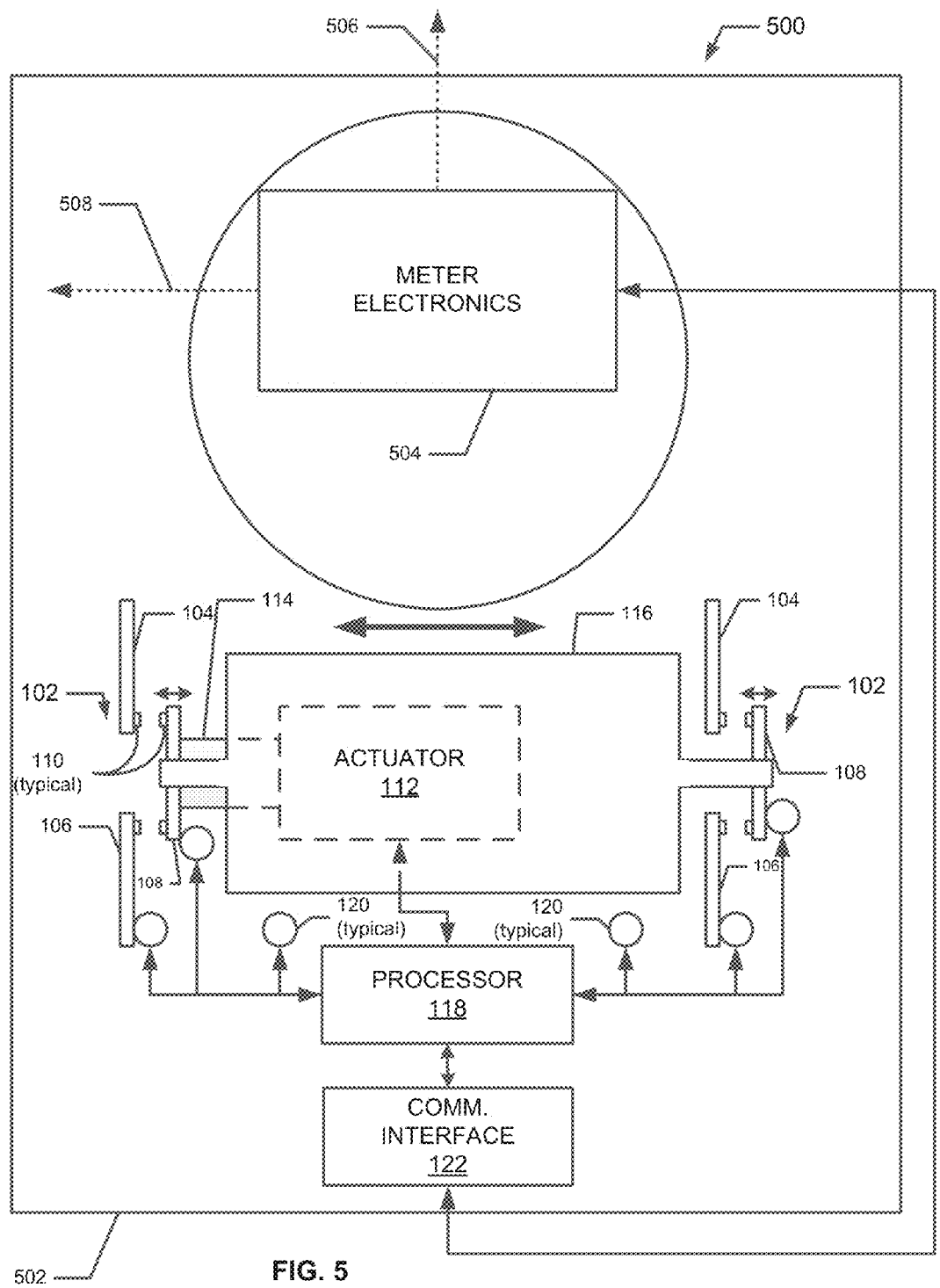
FIG. 5 illustrates yet another embodiment of a remote disconnect switch assembly.

FIG. 5 is an exemplary illustration of a remote disconnect switch assembly 500 wherein the actuator 112, shuttle 116, one or more disconnect switches 102, one or more sensors 120, communication interface 122, and processor 118 are located substantially within the base of a smart meter 502. Further comprising the smart meter 502 are meter electronics 504. In one aspect, the meter electronics 504 can be configured to communicate via a second network 508 with the loads served by the meter 502. In one aspect, the meter 502 can be configured to communicate wirelessly with the loads using, for example, a network such as a home area network (HAN). In one aspect, the loads can be devices such as smart appliances, as known to one of ordinary skill in the art. Smart appliances are available from vendors or manufacturers such as, for example, General Electric Company, Whirlpool Corporation (Benton Harbor, Mich.), LG Electronics USA (Englewood Cliffs, N.J.), among others. In some instances, utility providers desire to electronically communicate with the meters 502 for numerous purposes including scheduling disconnection or connection of utility services to the loads, automatic meter reading (AMR), load shedding and load control, automatic distribution and smart-grid applications, outage reporting, providing additional services such as Internet, video, and audio, etc. In many of these instances, the meters 502 can be configured to communicate with one or more computing devices through a communications network 506, which can be wired, wireless or a combination of wired and wireless, as known to one of ordinary skill in the art. In one aspect, the communications network 506 can comprise at least part of a smart grid network. As shown in FIG. 5, this communications network 506 can also be used to communicate with the processor 118 of the remote disconnect switch assembly through the meter electronics 504.

Figure 6:
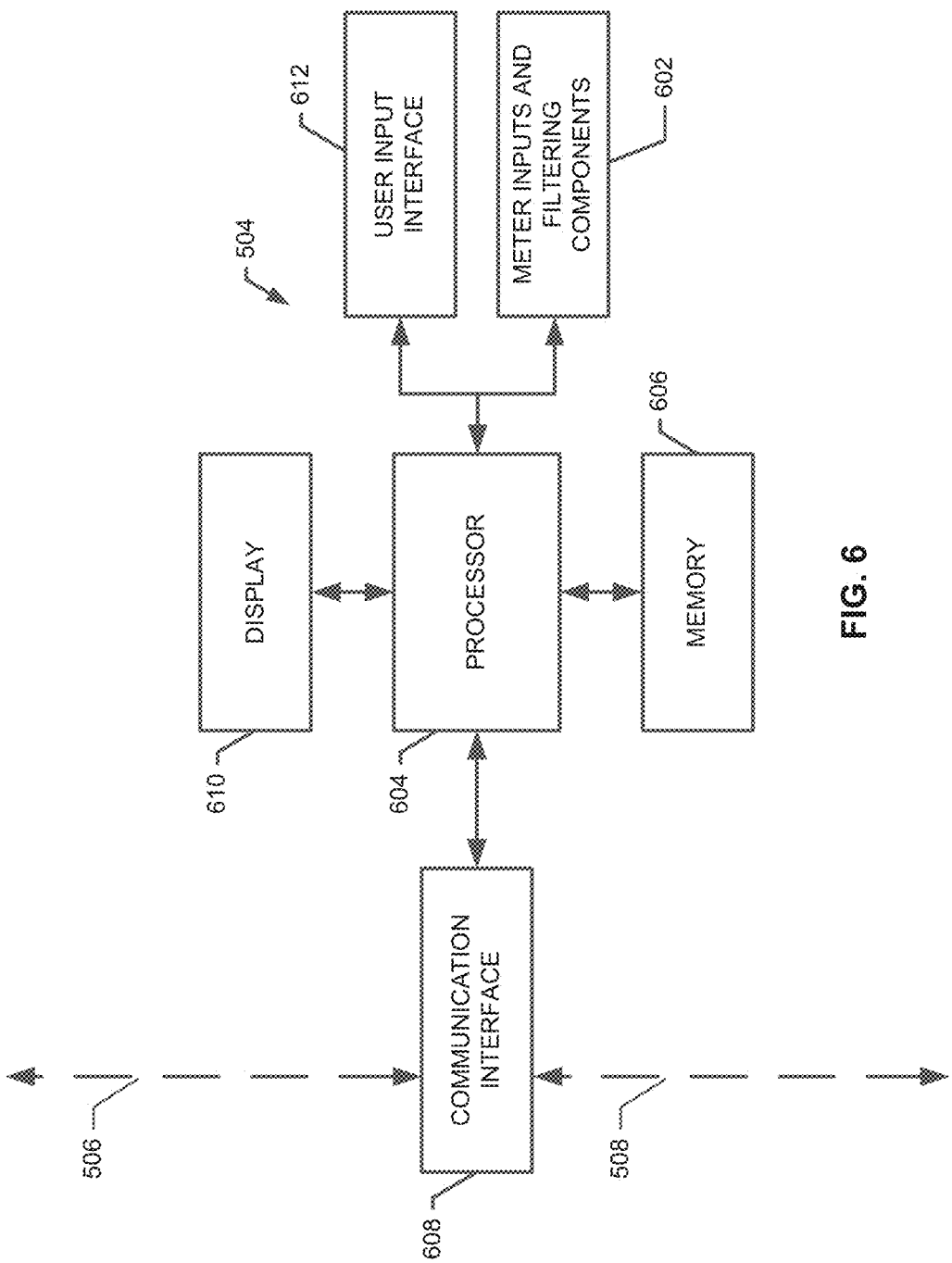
FIG. 6 illustrates a block diagram of an entity capable of operating as meter electronics in accordance with one embodiment of the present invention.

Referring now to FIG. 6, a block diagram of an entity capable of operating as meter electronics 504 is shown in accordance with one embodiment of the present invention. The entity capable of operating as meter electronics 504 includes various means for performing one or more functions in accordance with embodiments of the present invention, including those more particularly shown and described herein. It should be understood, however, that one or more of the entities may include alternative means for performing one or more like functions, without departing from the spirit and scope of the present invention. As shown, the entity capable of operating as meter electronics 504 can generally include means, such as one or more processors 604 for performing or controlling the various functions of the entity. As shown in FIG. 6, in one embodiment, meter electronics 504 can comprise meter inputs and filtering components 602. In one aspect, the meter inputs and filter components 602 can comprise, for example, voltage and current inputs, one or more ADCs, and filtering components. Further comprising this embodiment of meter electronics 504 is a processor 604 and memory 606. In one embodiment, the one or more processors 604 are in communication with or include memory 606, such as volatile and/or non-volatile memory that stores content, data or the like. For example, the memory 606 may store content transmitted from, and/or received by, the entity. Also, for example, the memory 606 may store software applications, instructions or the like for the processor 604 to perform steps associated with operation of the entity in accordance with embodiments of the present invention.

In addition to the memory 606, the one or more processors 604 can also be connected to at least one interface or other means for displaying, transmitting and/or receiving data, content or the like. In this regard, the interface(s) can include at least one communication interface 608 or other means for transmitting and/or receiving data, content or the like, as well as at least one user interface that can include a display 610 and/or a user input interface 612. The user input interface 612, in turn, can comprise any of a number of devices allowing the entity to receive data from a user, such as a keypad, a touch display, a joystick or other input device.

Figure 7:
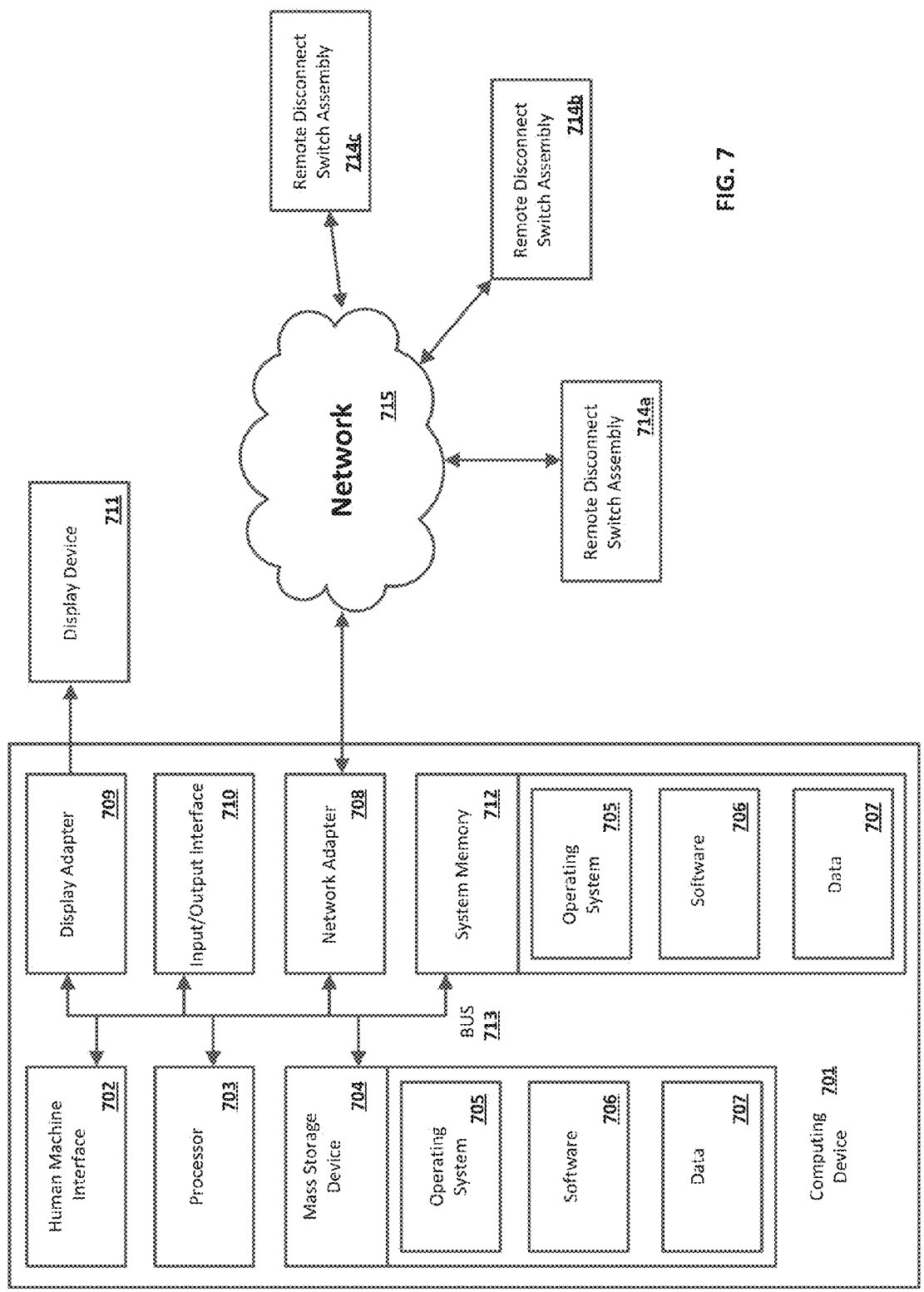
FIG. 7 is a block diagram illustrating an exemplary operating environment for performing aspects of the disclosed invention.

The above embodiments have been described above as comprised of units. One skilled in the art will appreciate that this is a functional description and that software, hardware, or a combination of software and hardware can perform the respective functions. A unit, such as a smart appliance or device, a smart meter, a smart grid, a utility computing device, a vendor or manufacturer's computing device, etc., can be software, hardware, or a combination of software and hardware. The units can comprise software 706 used to communicate with one or more remote disconnect switch assemblies, as illustrated in FIG. 7 and described below. In one exemplary aspect, the units can comprise a computing device 701 as illustrated in FIG. 7 and described below.

FIG. 7 is a block diagram illustrating an exemplary operating environment for performing aspects of the disclosed invention. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well-known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, smart meters, smart-grid components, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computer 701. The components of the computer 701 can comprise, but are not limited to, one or more processors or processing units 703, a system memory 712, and a system bus 713 that couples various system components including the processor 703 to the system memory 712. In the case of multiple processing units 703, the system can utilize parallel computing.

The system bus 713 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 713, and all buses specified in this description can also be implemented over a wired or wireless network connection and each of the subsystems, including the processor 703, a mass storage device 704, an operating system 705, software 706, data 707, a network adapter 708, system memory 712, an Input/Output Interface 710, a display adapter 709, a display device 711, and a human machine interface 702, can be contained within one or more remote computing devices or clients at physically separate locations, connected through buses of this form, in effect implementing a fully distributed system or distributed architecture.

The computer 701 typically comprises a variety of computer readable media. Exemplary readable media can be any available media that is non-transitory and accessible by the computer 701 and comprises, for example and not meant to be limiting, both volatile and non-volatile media, removable and non-removable media. The system memory 712 comprises computer readable media in the form of volatile memory, such as random access memory (RAM), and/or non-volatile memory, such as read only memory (ROM). The system memory 712 typically contains data such as meter communication data 707 and/or program modules such as operating system 705 and software 706 that are immediately accessible to and/or are presently operated on by the processing unit 703.

In another aspect, the computer 701 can also comprise other non-transitory, removable/non-removable, volatile/non-volatile computer storage media. By way of example, FIG. 7 illustrates a mass storage device 704 that can provide non-volatile storage of computer code, computer readable instructions, data structures, program modules, and other data for the computer 708. For example and not meant to be limiting, a mass storage device 704 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 704, including by way of example, an operating system 705 and software 706. Each of the operating system 705 and software 706 (or some combination thereof) can comprise elements of the programming and the software 706. Data 707 can also be stored on the mass storage device 704. Data 707 can be stored in any of one or more databases known in the art. Examples of such databases comprise, DB2® (IBM Corporation, Armonk, N.Y.), Microsoft® Access, Microsoft® SQL Server, (Microsoft Corporation, Bellevue, Wash.), Oracle®, (Oracle Corporation, Redwood Shores, Calif.), mySQL, PostgreSQL, and the like. The databases can be centralized or distributed across multiple systems.

In another aspect, the user can enter commands and information into the computer 701 via an input device (not shown). Examples of such input devices comprise, but are not limited to, a keyboard, pointing device (e.g., a "mouse"), a microphone, a joystick, a scanner, tactile input devices such as gloves, and other body coverings, and the like. These and other input devices can be connected to the processing unit 703 via a human machine interface 702 that is coupled to the system bus 713, but can be connected by other interface and bus structures, such as a parallel port, game port, an IEEE 1394 Port (also known as a Firewire port), a serial port, or a universal serial bus (USB).

In yet another aspect, a display device 711 can also be connected to the system bus 713 via an interface, such as a display adapter 709. It is contemplated that the computer 701 can have more than one display adapter 709 and the computer 701 can have more than one display device 711. For example, a display device can be a monitor, an LCD (Liquid Crystal Display), or a projector. In addition to the display device 711, other output peripheral devices can comprise components such as speakers (not shown) and a printer (not shown), which can be connected to the computer 701 via Input/Output Interface 710. Any step and/or result of the methods can be output in any form to an output device. Such output can be any form of visual representation, including, but not limited to, textual, graphical, animation, audio, tactile, and the like.

The computer 701 can operate in a networked environment using logical connections to one or more remote computing devices or clients and remote disconnect switch assemblies 714a,b,c. By way of example, a remote computing device can be a personal computer, portable computer, a server, a router, a network computer, a smart meter, a vendor or manufacture's computing device, a remote disconnect switch assembly, smart grid components, a peer device or other common network node, and so on. Logical connections between the computer 701 and remote computing devices or clients and remote disconnect switch assemblies 714a,b,c can be made via a local area network (LAN) and a general wide area network (WAN). Such network connections can be through a network adapter 708. A network adapter 708 can be implemented in both wired and wireless environments. Such networking environments are conventional and commonplace in offices, enterprise-wide computer networks, intranets, and other networks 715 such as the Internet or an AMI network.

For purposes of illustration, application programs and other executable program components such as the operating system 705 are illustrated herein as discrete blocks, although it is recognized that such programs and components reside at various times in different storage components of the computing device 701, and are executed by the data processor(s) of the computer. An implementation of the software 706 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

As described above and as will be appreciated by one skilled in the art, embodiments of the present invention may be configured as a system, method, or computer program product. Accordingly, embodiments of the present invention may be comprised of various means including entirely of hardware, entirely of software, or any combination of software and hardware. Furthermore, embodiments of the present invention may take the form of a computer program product on a computer-readable storage medium having computer-readable program instructions (e.g., computer software) embodied in the storage medium. Any suitable non-transitory computer-readable storage medium may be utilized including hard disks, CD-ROMs, optical storage devices, or magnetic storage devices.

Embodiments of the present invention have been described above with reference to block diagrams and flowchart illustrations of methods, apparatuses (i.e., systems) and computer program products. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus, such as the processor 118 discussed above with reference to FIGS. 1-5, to produce a machine, such that the instructions which execute on the computer or other programmable data processing apparatus create a means for implementing the functions specified in the flowchart block or blocks.

These computer program instructions may also be stored in a non-transitory computer-readable memory that can direct a computer or other programmable data processing apparatus (e.g., such as the processor 118 discussed above with reference to FIGS. 1-5) to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A remote disconnect switch assembly comprised of:
   an actuator;
   a shuttle that is operably moved by the actuator;
   one or more disconnect switches that are opened or closed by movement of the shuttle;
   one or more sensors;
   a communication interface;
   a processor, wherein the processor is operably connected with the actuator, the one or more sensors and the communication interface, and wherein the processor is configured to:
   communicate with one or more other computing devices over a network using the communication interface;
   receive signals from the one or more sensors; and
   cause the actuator to operate in accordance with the signals received from the one or more sensors or the communications with the one or more other computing devices; and
   a memory operably connected with the processor, wherein information about the remote disconnect switch assembly is stored on the memory, wherein the processor configured to receive signals from the one or more sensors and cause the actuator to operate in accordance with the signals received from the one or more sensors comprises the processor receiving information about an actual state of at least one of the one or more disconnect switches from the one or more sensors, comparing the actual state to a desired state of the at least one of the one or more disconnect switches, wherein the desired state is stored in the memory, and causing the at least one of the one or more disconnect switches to open or close in accordance with the desired state if the actual state of the at least one of the one or more disconnect switches is different than the desired state.

2. The remote disconnect switch assembly of claim 1, wherein the one or more sensors comprise one or more of an accelerometer, a temperature sensor, a magnetic sensor, a limit switch, and a humidity sensor.

3. The remote disconnect switch assembly of claim 1, wherein the communication interface comprises a wireless communication interface.

4. The remote disconnect switch assembly of claim 1, wherein the processor comprises an MSP430™ microcontroller.

5. The remote disconnect switch assembly of claim 1, wherein the information about the remote disconnect switch assembly stored on the memory comprises one or more of a state of the one or more disconnect switches, temperature information, vibration information, humidity information, tamper detection information and actuation information about the one or more disconnect switches.

6. The remote disconnect switch assembly of claim 1, further comprising a utility revenue meter, wherein the remote disconnect switch assembly is integrated into the utility revenue meter.

7. The remote disconnect switch assembly of claim 1, wherein the utility revenue meter is an electric utility revenue meter.

8. The remote disconnect switch assembly of claim 1, further comprising an enclosure, wherein the actuator, shuttle, one or more disconnect switches, one or more sensors, communication interface, and processor are located substantially within the enclosure.

9. A remote disconnect switch assembly comprised of:
an enclosure;
an actuator;
a shuttle that is operably moved by the actuator;
one or more disconnect switches that are opened or closed by movement of the shuttle;
one or more sensors;
a communication interface;
a memory; and
a processor, wherein the processor is operably connected with the actuator, the one or more sensors, the memory and the communication interface, and wherein the processor is configured to:
communicate with one or more other computing devices over a network using the communication interface;
receive signals from the one or more sensors; and
cause the actuator to operate in accordance with the signals received from the one or more sensors or the communications with the one or more other computing devices, and
wherein the actuator, shuttle, one or more disconnect switches, one or more sensors, communication interface, and processor are located substantially within the enclosure, wherein the processor configured to receive signals from the one or more sensors and cause the actuator to operate in accordance with the signals received from the one or more sensors comprises the processor receiving information about an actual state of at least one of the one or more disconnect switches from the one or more sensors, comparing the actual state to a desired state of the at least one of the one or more disconnect switches, wherein the desired state is stored in the memory, and causing the at least one of the one or more disconnect switches to open or close in accordance with the desired state if the actual state of the at least one of the one or more disconnect switches is different than the desired state.

10. The remote disconnect switch assembly of claim 9, wherein the one or more sensors comprise one or more of an accelerometer, a temperature sensor, a magnetic sensor, a limit switch, and a humidity sensor.

11. The remote disconnect switch assembly of claim 9, wherein the communication interface comprises a wireless communication interface.

12. The remote disconnect switch assembly of claim 9, wherein the processor comprises an MSP430™ microcontroller.

13. The remote disconnect switch assembly of claim 9, wherein information about the remote disconnect switch assembly is stored on the memory.

14. The remote disconnect switch assembly of claim 13, wherein the information about the remote disconnect switch assembly stored on the memory comprises one or more of a state of the one or more disconnect switches, temperature information, vibration information, humidity information, tamper detection information and actuation information about the one or more disconnect switches.

15. The remote disconnect switch assembly of claim 9, wherein the enclosure comprises a base of a utility revenue meter and the remote disconnect switch assembly is integrated into the base of the utility revenue meter.

16. The remote disconnect switch assembly of claim 15, wherein the utility revenue meter is an electric utility revenue meter.

* * * * *